(12) United States Patent
Yip et al.

(10) Patent No.: US 7,384,819 B2
(45) Date of Patent: Jun. 10, 2008

(54) METHOD OF FORMING STACKABLE PACKAGE

(75) Inventors: Heng Keong Yip, Selangor Darul Ehsan (MY); Lan Chu Tan, Selangor (MY)

(73) Assignee: Freescale Semiconductor, Inc., Austin, TX (US)

( * ) Notice: Subject to any disclaimer, the term of this patent is extended or adjusted under 35 U.S.C. 154(b) by 144 days.

(21) Appl. No.: 11/414,440

(22) Filed: Apr. 28, 2006

(65) Prior Publication Data

US 2007/0254409 A1  Nov. 1, 2007

(51) Int. Cl.
*H01L 21/44* (2006.01)
(52) U.S. Cl. .................. 438/109; 438/107; 438/108; 438/110; 438/E23.177; 254/778; 254/787
(58) Field of Classification Search ........ 438/106–110; 257/778–787
See application file for complete search history.

(56) References Cited

U.S. PATENT DOCUMENTS

| | | | |
|---|---|---|---|
| 5,200,362 A | 4/1993 | Lin et al. | |
| 5,757,080 A | 5/1998 | Sota | |
| 6,759,268 B2 | 7/2004 | Akagawa | |
| 6,762,488 B2 | 7/2004 | Maeda et al. | |
| 6,885,093 B2 | 4/2005 | Lo et al. | |
| 6,903,443 B2 | 6/2005 | Farnworth et al. | |
| 6,908,792 B2 | 6/2005 | Bruce et al. | |
| 7,247,934 B2 * | 7/2007 | Pu ............................ | 257/686 |
| 2003/0207515 A1 | 11/2003 | Tan et al. | |
| 2003/0224542 A1 | 12/2003 | Liu | |
| 2004/0065963 A1 | 4/2004 | Karnezos | |
| 2004/0089955 A1 | 5/2004 | Zhou | |
| 2004/0145046 A1 * | 7/2004 | Yamashita et al. .......... | 257/706 |

* cited by examiner

*Primary Examiner*—Dung A. Le
(74) *Attorney, Agent, or Firm*—Charles Bergere

(57) ABSTRACT

A method of forming a semiconductor package (50 and 52) includes providing a substrate (14) having a die pad and bond pads on a first surface (20) and conductive pads (66, 68 and 74) on a second surface (22). An integrated circuit (IC) die (38) is attached to the die pad and the first surface (20) of the substrate (14) is attached to a lead frame (26). The substrate (14) is electrically connected to the lead frame (26), and the IC die (38) is electrically connected to the substrate (14) and the lead frame (26). The IC die (14), the electrical connections (40, 42 and 44), a portion of the substrate (14) and a portion of the lead frame (26) are encapsulated with a mold compound (46), forming a stackable package (48). The conductive pads (66, 68 and 74) on the second surface (22) of the substrate (14) are not encapsulated by the mold compound (46).

11 Claims, 5 Drawing Sheets

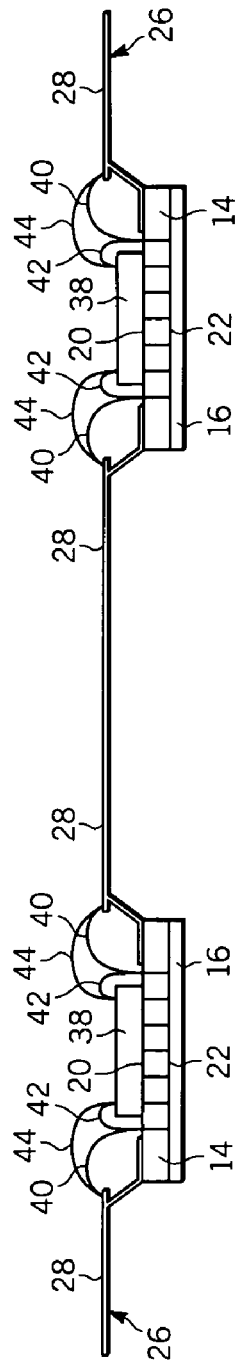
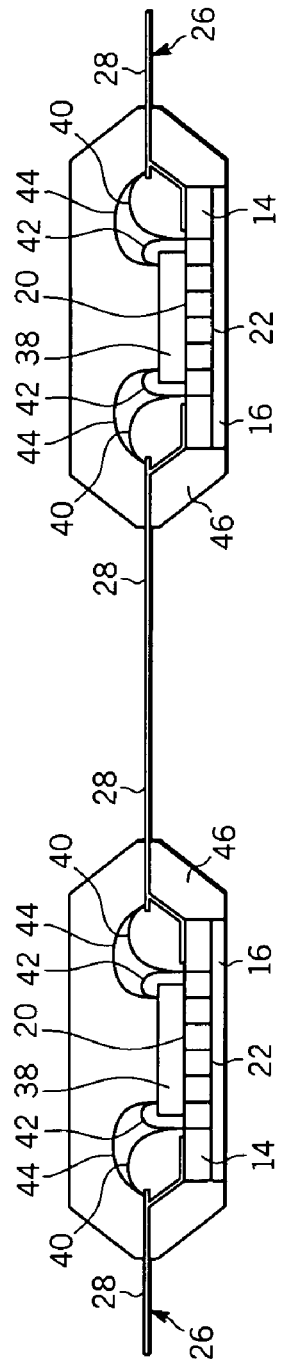

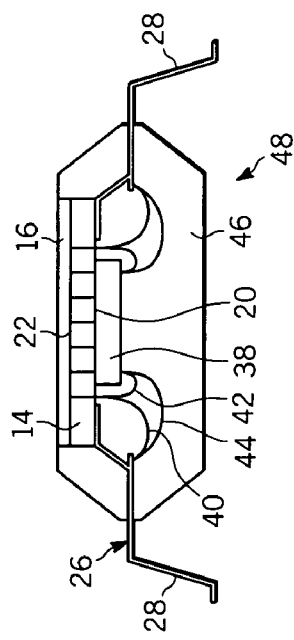
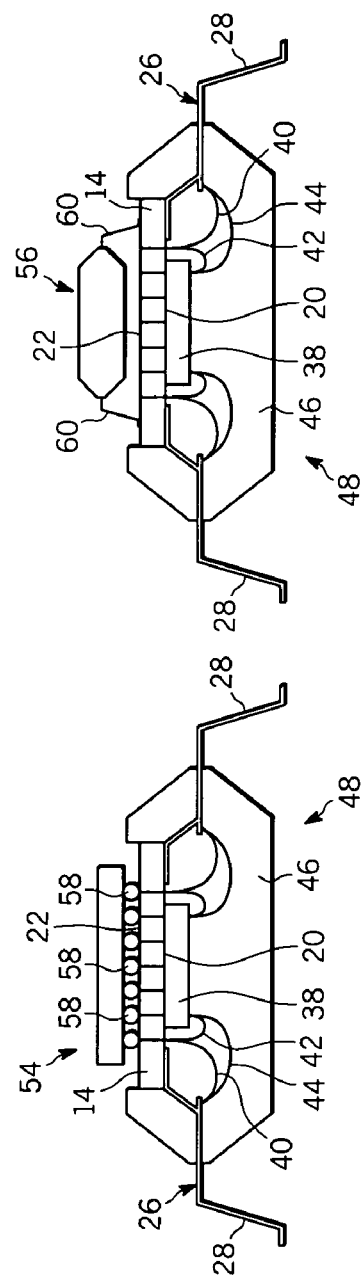

US 7,384,819 B2

METHOD OF FORMING STACKABLE PACKAGE

BACKGROUND OF THE INVENTION

The present invention relates to the packaging of integrated circuits (ICs) and more particularly to Package-on-Package (PoP) stacking and a method of forming a stackable package.

Package-on-Package (PoP) stacks are a type of three-dimensional (3D) semiconductor package being developed to meet the demand for smaller electronic devices with greater functionality and higher performance at lower costs. PoP stacking typically involves stacking a pre-tested package atop another packaged integrated circuit. Advantageously, PoP stacking enables the integration of two or more electrically tested devices within a small footprint, thereby conserving precious real estate on the printed circuit board (PCB) and achieving high final test yields. In view of these and other advantages associated with PoP stacking, it would be desirable to provide a method of forming a stackable package for PoP stacking.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

FIG. 3 is an enlarged cross-sectional view of a plurality of integrated circuit (IC) dice attached to the respective substrates of FIG. 2 and electrical connections formed between the IC dice, the substrates and the lead frames;

FIG. 4 is an enlarged cross-sectional view of a mold compound encapsulating the IC dice, the electrical connections, a portion of the substrates and a portion of the lead frames of FIG. 3;

FIG. 5 is an enlarged cross-sectional view of a plurality of stackable packages formed in accordance with an embodiment of the present invention;

FIG. 6 is an enlarged cross-sectional view of a plurality of package stacks formed in accordance with another embodiment of the present invention;

DETAILED DESCRIPTION OF THE INVENTION

Figure 1:
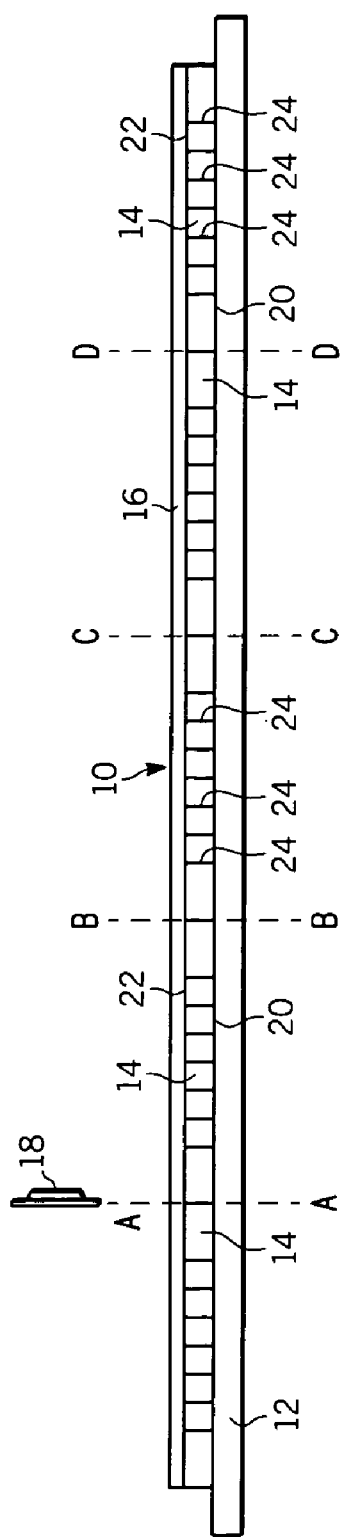
FIG. 1 is an enlarged cross-sectional view of a film laminated substrate being singulated into a plurality of substrates.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

The present invention provides a method of forming a semiconductor package including the step of providing a substrate having a die pad and a plurality of bond pads on a first surface thereof and a plurality of conductive pads on a second surface thereof. The first surface of the substrate is attached to a lead frame, and an integrated circuit (IC) die is attached to the die pad on the first surface of the substrate. The substrate is electrically connected to the lead frame, and the IC die is electrically connected to the substrate and the lead frame. The IC die, the electrical connections, a portion of the substrate and a portion of the lead frame are encapsulated with a mold compound, thereby forming a stackable package. The conductive pads on the second surface of the substrate are exposed so that a semiconductor device can be attached to the second surface of the substrate and electrically coupled to the IC die by way of the conductive pads.

The present invention also provides a method of forming a semiconductor package including the step of providing a substrate having a die pad and a plurality of bond pads on a first surface thereof and a plurality of conductive pads on a second surface thereof. A film is attached to the second surface of the substrate. The first surface of the substrate is attached to a lead frame, and an integrated circuit (IC) die is attached to the die pad on the first surface of the substrate. The substrate is electrically connected to the lead frame, and the IC die is electrically connected to the substrate and the lead frame. The IC die, the electrical connections, a portion of the substrate and a portion of the lead frame are encapsulated with a mold compound, thereby forming a stackable package. The conductive pads on the second surface of the substrate are not encapsulated by the mold compound. The film is removed from the second surface of the substrate to expose the conductive pads, and then one or more external semiconductor devices are electrically coupled to the conductive pads on the second surface of the substrate.

The present invention further provides a method of forming a plurality of stacked packages including the step of providing a plurality of substrates, such as in strip form, each substrate having a die pad and a plurality of bond pads on a first surface thereof and a plurality of conductive pads on a second surface thereof. The first surfaces of the substrates are attached to respective ones of a plurality of lead frames, and a plurality of integrated circuit (IC) dice is attached to the respective die pads. The respective substrates, IC dice and the lead frames are electrically connected to each other and then encapsulated with a mold compound, thereby forming a plurality of semiconductor packages. The conductive pads on the second surfaces of the substrates are left exposed. A plurality of semiconductor devices are then attached to the second surfaces of the substrates such that they are electrically connected to the respective IC dice, thereby forming a plurality of stacked packages.

FIGS. 1 through 6 are enlarged cross-sectional views that illustrate a method of forming a plurality of semiconductor packages in accordance with an embodiment of the present invention.

Referring now to FIG. 1, a substrate 10 mounted on a dicing tape 12 is provided as shown. The substrate 10 includes a plurality of individual substrates 14. An adhesive film 16 is attached on an opposing side of the substrate 10 such that the substrate 10 is sandwiched between the dicing tape 12 and the adhesive film 16. A singulating operation may be performed along the vertical lines A-A, B-B, C-C and D-D with a saw 18 to separate the individual substrates 14 from each other.

Each substrate 14 includes a die pad (not shown) and a plurality of bond pads (not shown) on a first surface 20 thereof, and a plurality of surface mount lands or conductive pads (not shown) for electronic component attachment on a second surface 22 thereof. The bond pads on the first surface 20 of the substrate 14 and the conductive pads on the second surface 22 may be electrically connected by one or more plated-through holes, solid vias or some other conductors in the substrate 14. In the embodiment shown, the substrates 14 are two-layer substrates having respective arrays of vias 24. Nonetheless, those of skill in the art will understand that the present invention is not limited to two-layer substrates. For example, the substrates 14 may be multi-layer substrates in alternative embodiments. In one embodiment, the substrates 14 have a thickness of about 0.25 millimetres (mm). The substrates 14 may be made of Bismaleimide-Triazine (BT) and the die attach pads, bond pads and conductive pads may be made of copper. The film 16 is attached to the second surface 22 of each substrate 14 and serves as a protective layer therefor. The film 16 may be an adhesive tape made of Polyimide. In one embodiment, the film 16 has a thickness of about 0.1 mm.

The dicing tape 12 may be a polyvinyl chloride (PVC) film with a synthetic adhesive on one side to hold the substrate 10 in place during the singulation operation. In the embodiment shown, the substrate 10 is singulated by saw singulation. Nonetheless, those of skill in the art will understand that the present invention is not limited by the singulation method employed. For example, the substrate 10 may be singulated by punching or laser cutting or other suitable singulation methods in alternative embodiments.

Figure 2:
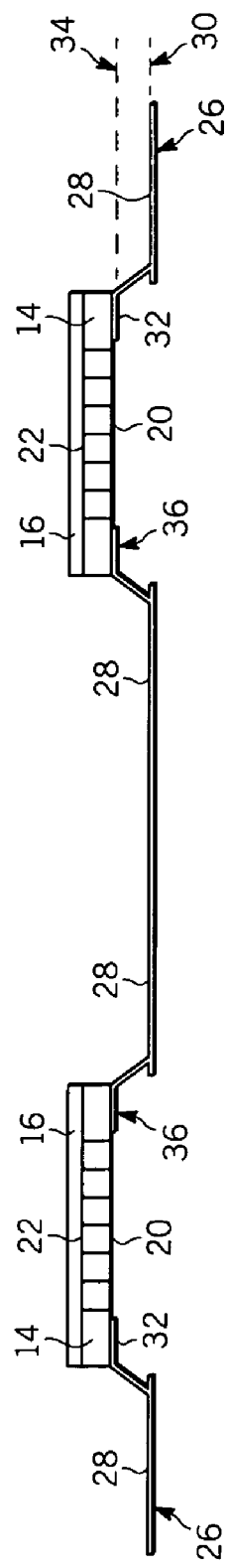
FIG. 2 is an enlarged cross-sectional view of a plurality of the substrates of FIG. 1 attached to respective ones of a plurality of lead frames.

Referring now to FIG. 2, a plurality of the individual substrates 14 singulated from the substrate 10 of FIG. 1 is attached to respective ones of a plurality of lead frames 26 as shown. Each lead frame 26 comprises a plurality of leads 28 lying substantially in a first plane 30 and a down-set portion 32, coupled to respective ones of the leads 28, lying in a second plane 34 vertically spaced from and substantially parallel to the first plane 30. The lead frames 26 may be constructed from a flat sheet of an alloy, such as Alloy42, by stamping or etching. Such lead frames 26 are known in the art and commercially available. As shown in FIG. 2, the lead frames 26 are positioned in a "dead bug" orientation (up-side-down) for the attachment of the substrates 14. As can be seen, the first surfaces 20 of the substrates 14 are attached to the respective down-set portions 32 of the lead frames 26, and more particularly, to an underside 36 of the down-set portions 32. The substrates 14 may be attached to the respective lead frames 26 in a variety of ways such as with glue or an adhesive material placed on the underside 36 of the down-set portions 32 of the lead frames 26, as known by those of skill in the art.

Referring now to FIG. 3, a plurality of integrated circuit (IC) dice 38 is attached to the respective die pads on the first surfaces 20 of the substrates 14. As shown in FIG. 3, the substrates 14 are electrically connected to the respective lead frames 26, and the IC dice 38 are electrically connected to the respective substrates 14 and the respective lead frames 26. More particularly, the bond pads on the first surfaces 20 of the substrates 14 are electrically connected to respective ones of the leads 28 on the lead frames 26 via first bond wires 40, while bond pads (not shown) on the IC dice 38 are electrically connected to respective ones of the bond pads on the substrates 14 and respective ones of the leads 28 via second and third bond wires 42 and 44, respectively.

The IC dice 38 may be any type of circuit such as, for example, a digital signal processor (DSP) or a special function circuit. The IC dice 38 are not limited to a particular technology such as CMOS, or derived from any particular wafer technology. Further, the present invention can accommodate dice of various dimensions. A typical example is a CMOS die having a size of about 6 mm×6 mm, and a thickness of about 11 mils. The IC dice 38 are attached to the lead frames 26 using a die attach material (not shown) such as epoxy. Such die attach materials are known in the art and commercially available. The first, second and third bond wires 40, 42 and 44 are of a type common to packaged integrated circuits and known to those of skill in the art. In one embodiment, the bond wires 40, 42 and 44 are connected to the bond pads and the lead frame leads 28 using a wire bonding process and commercially available wire bonding apparatus. The bond wires may be copper, gold or the like, and have a diameter of between about 50 to 100 μm. Bond wires made of other materials and of different diameters also may be suitable.

Referring now to FIG. 4, the IC dice 38, the bond wires (electrical connections) 40, 42 and 44, a portion of the substrates 14 and a portion of the lead frames 26 are encapsulated with a mold compound 46, thereby forming a plurality of stackable packages 48. The film 16 prevents the mold compound 46 from bleeding onto the conductive pads on the second surfaces 32 of the substrates 14. Thus, the conductive pads on the second surfaces 22 of the substrates 14 are left exposed. That is, the conductive pads are not encapsulated with the mold compound 46. A well known molding process such as, for example, an injection molding process may be used to perform the encapsulation. The mold compound 46 may comprise well known commercially available molding materials such as plastic or epoxy. Since the conductive pads are exposed (once the adhesive film 16 is removed), the stackable package 48 can be subjected to a variety of tests such as power and ground continuity checks, as well as functional tests.

Referring now to FIG. 5, the encapsulated IC dice 38 are separated from other ones of the encapsulated IC dice 38, for example, by punch singulation or other suitable singulation techniques known to those of skill in the art. In the embodiment shown, the leads 28 are shaped into gull wing (GW) leads. Nonetheless, those of skill in the art will understand that the stackable packages 48 of the present invention are not limited to GW leads. For instance, the leads 28 may be J-shaped in alternative embodiments. Further, although FIGS. 1 to 5 show the formation of only two (2) stackable packages 48, it will be understood that fewer or more stackable packages 48 may be formed substantially simultaneously in accordance with the present invention. Each of the stackable packages 48 is capable of functioning independently. Advantageously, however, each stackable package 48 is integrated with one or more other external semiconductor devices, as shown in FIG. 6 and described below, to perform additional functions.

Referring now to FIG. 6, a first stacked package 50 and a second stacked package 52 are shown. The first and second package stacks 50 and 52 are formed by removing or peeling off the films 16 from the second surfaces 22 of the substrates 14 to expose the conductive pads, and electrically coupling first and second external semiconductor devices 54 and 56 to the conductive pads on the second surfaces 22 of the respective substrates 14. As shown in FIG. 6, the first external semiconductor device 54 is electrically coupled to the conductive pads via a plurality of conductive balls 58 such as, for example, controlled collapse chip carrier connection (C5) solder balls, and the second external semiconductor device 56 is electrically coupled to the conductive pads via a plurality of leads 60.

The first external semiconductor device 54 may be a Wafer Level Chip Scale Package (WLCSP) or a Mold Array Process-Ball Grid Array (MAPBGA) package. The second external semiconductor device 56 may be a leaded package such as, for example, a Quad Flat Pack (QFP) package, a Thin Small Outline Package (TSOP), a Small Outline Integrated Circuit (SOIC) package, a Small Outline J-Lead (SOJ) package or a Plastic Leaded Chip Carrier (PLCC) package. Nevertheless, it should be understood that the present invention is not limited to the types of external semiconductor devices described above. In other embodiments, the first and second external semiconductor devices 54 and 56 may be non-leaded packages, such as Quad Flat No-Lead (QFN) packages, Land Grid Array (LGA) packages or passive components. Although only one (1) external semiconductor device is electrically coupled to each stackable package 48 in FIG. 6, those of skill in the art will understand that each stackable package 48 can accommodate one or more external semiconductor devices, depending on the layout of the conductive pads on the second surface 22 of the substrate 14 and the internal circuitry within the substrate 14.

The first and second external semiconductor devices 54 and 56 may be electrically coupled to the respective substrates 14 by soldering the conductive balls 58 and the leads 60 onto the corresponding conductive pads on the second surfaces 22 of the substrates 14. Such surface mount processes are known by those of skill in the art and therefore, further explanation is not necessary for a complete understanding of the invention.

In the embodiment shown, the substrates 14 not only provide the respective IC dice 38 with mechanical support, but also serve as interposers providing electrical connection between the IC dice 38 housed within the stackable packages 48 and the respective external semiconductor devices 54 and 56 mounted thereon. The substrates 14, functioning as interposers, provide the IC dice 38 with an additional means of external electrical connection other than the leads 28 of the lead frames 26.

In a further embodiment, the external semiconductor devices 54 and 56 and at least a portion of the stackable packages 48 may be further encapsulated.

Figure 7:
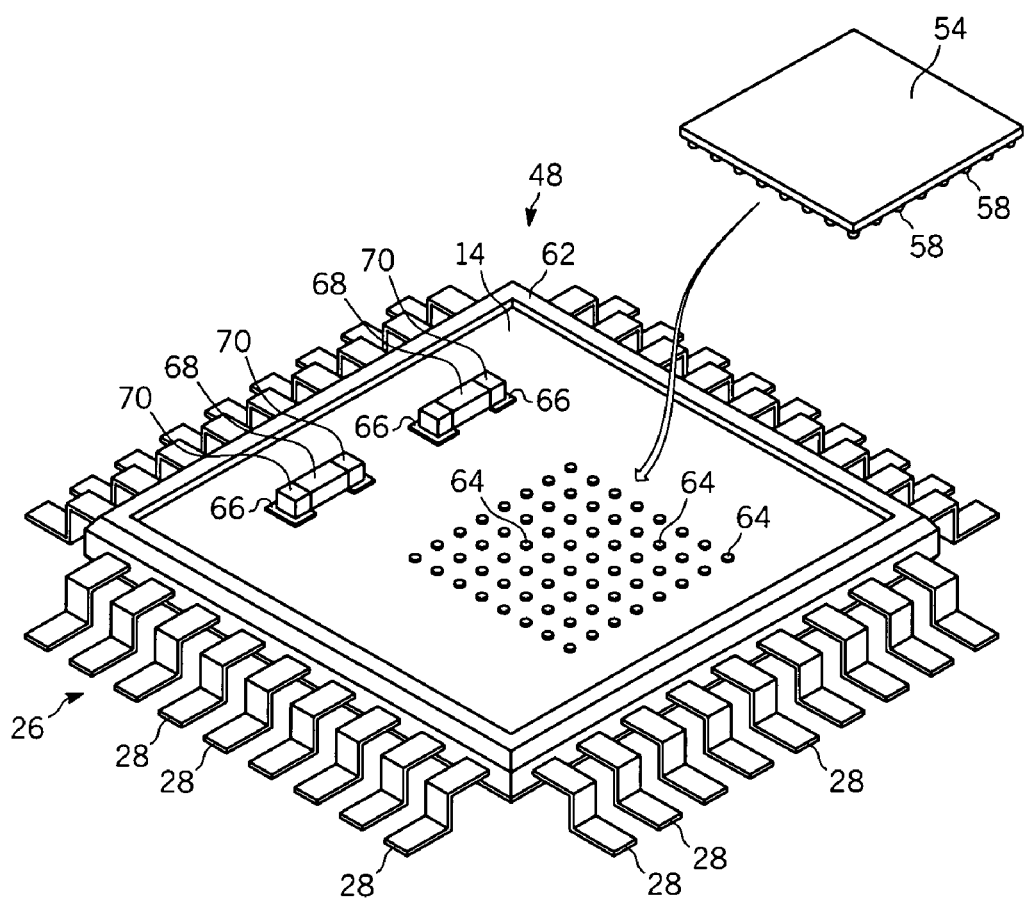
FIG. 7 is an enlarged perspective view of a stackable package and a plurality of external semiconductor devices in accordance with an embodiment of the present invention.

Referring now to FIG. 7, an enlarged perspective view of one embodiment of the stackable package 48 and the first external semiconductor device 54 of FIG. 6 are shown. The stackable package 48 includes a plastic-molded body 62 from which the gull wing (GW) leads 28 extend. The plastic-molded body 62 includes a partially encapsulated substrate 14 having first and second conductive pads 64 and 66 on an unencapsulated surface thereof. A plurality of passive components 68 having respective end terminations 70 are mounted on the second conductive pads 66. The passive components 68 may be one or more of resistors and capacitors. As shown in FIG. 7, the first and second conductive pads 64 and 66 are sized, shaped and arranged to receive respective ones of the external interconnection features (i.e. the conductive balls 58 and the end terminations 70) on the external semiconductor devices (i.e. the first external semiconductor device 54 and the passive components 68) mounted on the stackable package 48. More particularly, the first conductive pads 64 are generally circular in shape and arranged in an array to receive respective ones of the conductive balls 58 on the first external semiconductor device 54, while the second conductive pads 66 are generally rectangular in shape and arranged in a spaced apart relationship to receive respective ones of the end terminations 70 of the passive components 68.

Figure 8:
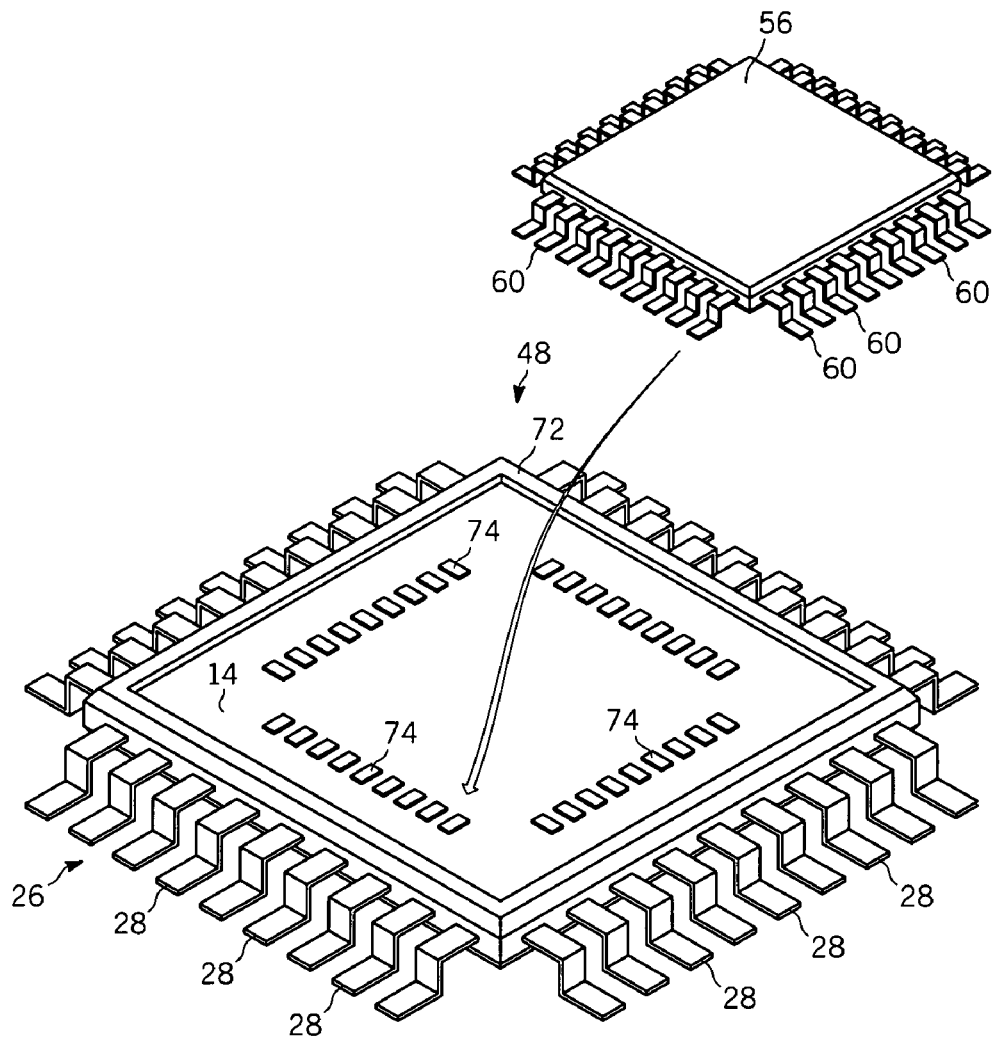
FIG. 8 is an enlarged perspective view of a stackable package and an external semiconductor device in accordance with an embodiment of the present invention.

Referring now to FIG. 8, an enlarged perspective view of the stackable package 48 and the second external semiconductor device 56 of FIG. 6 are shown. The stackable package 48 includes a plastic-molded body 72 from which the gull wing (GW) leads 28 extend. The plastic-molded body 72 includes a partially encapsulated substrate 14 having a plurality of conductive pads 74 on an exposed surface thereof. As shown in FIG. 8, the conductive pads 74 are sized, shaped and arranged to receive respective ones of the leads 60 on the second external semiconductor device 56. More particularly, the conductive pads 74 are generally rectangular in shape and arranged in a perimeter layout to receive respective ones of the perimeter gull wing (GW) leads 60 on the second external semiconductor device 56.

While a method of making a stackable package and a stacked package has been described, the present invention further is a semiconductor package, including a lead frame; a substrate attached on a first surface to the lead frame, the substrate having a die pad and a plurality of bond pads on the first surface and a plurality of conductive pads on a second surface; an integrated circuit (IC) die attached to the die pad on the first surface of the substrate; a plurality of bond wires electrically connecting the substrate to the lead frame, and the IC die to the substrate and the lead frame; and a mold compound encapsulating the IC die, the bond wires, a portion of the substrate and a portion of the lead frame, wherein the conductive pads on the second surface of the substrate are unencapsulated by the mold compound. A film may be attached to the second surface of the substrate to prevent mold compound from bleeding onto the second surface.

One or more external semiconductor devices may be electrically coupled to the conductive pads on the second surface of the substrate. The one or more external semiconductor devices may be electrically coupled to the conductive pads via one of a plurality of conductive balls and a plurality of leads. The one or more external semiconductor devices may be one or more of a Quad Flat Pack (QFP) package, a Thin Small Outline Package (TSOP), a Small Outline Integrated Circuit (SOIC) package, a Small Outline J-Lead (SOJ) package, a Plastic Leaded Chip Carrier (PLCC) package, a Wafer Level Chip Scale Package (WLCSP), a Mold Array Process-Ball Grid Array (MAPBGA) package, a Quad Flat No-Lead (QFN) package, a Land Grid Array (LGA) package and a passive component.

In one embodiment, the lead frame may include a plurality of leads lying substantially in a first plane, and a downset portion coupled to respective ones of the leads, the downset portion lying in a second plane vertically spaced from the first plane. The first surface of the substrate may be attached to the downset portion of the lead frame. More particularly, the first surface of the substrate may be attached to an underside of the downset portion of the lead frame.

As is evident from the foregoing discussion, the present invention provides a method of forming stackable packages and Package-on-Package (PoP) stacks. Advantageously, besides conserving precious real estate on the printed circuit board (PCB) and achieving high final test yields, the present invention provides the option of adding one or more functions to a semiconductor package without having to redesign an IC die. Additionally, because the stackable package of the present invention can accommodate various types of semiconductor packages, the present invention provides flexibility in mixing and matching integrated circuit (IC) technologies and allows device procurement from multiple manufacturing sources.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, although Quad Flat Pack (QFP) type stackable packages have been described, other types of leaded stackable packages can also be formed with the present invention. It is understood, therefore, that this invention is not limited to the particular embodiments disclosed, but covers modifications within the spirit and scope of the present invention as defined by the appended claims.

The invention claimed is:

1. A method of forming a plurality of stacked packages, comprising:
    providing a plurality of substrates, each substrate having a die pad and a plurality of bond pads on a first surface thereof and a plurality of conductive pads on a second surface thereof;
    attaching the first surfaces of the substrates to respective ones of a plurality of lead frames;
    attaching a plurality of integrated circuit (IC) dice to the respective die pads on the first surfaces of the substrates;
    electrically connecting the substrates, the respective lead frames and the respective IC dice;
    encapsulating the IC dice, the electrical connections, a portion of the substrates and a portion of the lead frames with a mold compound, wherein the conductive pads on the second surfaces of the substrates are exposed, thereby forming a plurality of packaged devices;
    attaching a plurality of semiconductor devices to respective ones of the second surfaces of the substrates, wherein the semiconductor devices are electrically connected to the respective IC dice by way of the conductive pads, thereby forming the stacked packages; and
    separating the stacked packages from other ones of the stacked packages.

2. The method of forming a plurality of stacked packages of claim 1, wherein the substrate provides electrical connection between the IC die and the at least one external semiconductor device.

3. The method of forming a plurality of stacked packages of claim 1, wherein the plurality of semiconductor devices is electrically coupled to the conductive pads via one of a plurality of conductive balls and a plurality of leads.

4. The method of forming a plurality of stacked packages of claim 1, wherein the plurality of semiconductor devices comprises one or more of a Quad Flat Pack (QEP) package, a Thin Small Outline Package (TSOP), a Small Outline Integrated Circuit (SOIC) package, a Small Outline J-Lead (SOJ) package, a Plastic Leaded Chip Carrier (PLCC) package, a Wafer Level Chip Scale Package (WLCSP), a Mold Array Process-Ball Grid Array (MAPBGA) package, a Quad Flat No-Lead (QFN) package, a Land Grid Array (LGA) package and a passive component.

5. The method of forming a plurality of stacked packages of claim 1, further comprising encapsulating the plurality of semiconductor devices.

6. The method of forming a plurality of stacked packages of claim 1, wherein each of the plurality of lead frames comprises:
    a plurality of leads lying substantially in a first plane; and
    a down-set portion coupled to respective ones of the leads, wherein the down-set portion lies in a second plane vertically spaced front the first plane.

7. The method of forming a plurality of stacked packages of claim 1, further comprising the step of testing the packaged devices prior to attaching the semiconductor devices to the substrates.

8. The method of forming a plurality of stacked packages of claim 1, wherein a film is attached to the second surface of each substrate.

9. The method of forming a plurality of stacked packages of claim 8, further comprising removing the film from the second surfaces of each of the substrates to expose the conductive pads.

10. The method of forming a plurality of stacked packages of claim 1, wherein the separation step comprises punch singulation.

11. The method of forming a plurality of stacked packages of claim 1, wherein the substrates are provided by performing a singulating operation on a film laminated substrate.

* * * * *